United States Patent
Chen

(10) Patent No.: US 7,379,300 B1
(45) Date of Patent: May 27, 2008

(54) FIXING MECHANISM FOR A FAN FIXING FRAME

(75) Inventor: Jung-Lung Chen, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/672,213

(22) Filed: Feb. 7, 2007

(51) Int. Cl.
*H05K 7/20* (2006.01)
*H05K 5/00* (2006.01)
*F28D 15/00* (2006.01)

(52) U.S. Cl. .............. 361/695; 165/104.33; 165/122; 174/16.1; 248/635; 248/638; 267/136; 312/236; 415/213.1; 417/363; 454/184

(58) Field of Classification Search ........ 361/694–695; 165/80.3, 104.33, 121–122; 174/16.1; 248/560, 248/634–635, 637–638; 267/136, 140, 140.13, 267/141, 141.2, 141.3, 151–153, 292; 312/236; 415/213.1; 417/363
See application file for complete search history.

(56) References Cited

U.S. PATENT DOCUMENTS

| | | | | |
|---|---|---|---|---|
| 2,719,017 A | * | 9/1955 | Spencer et al. | 267/141.5 |
| 5,622,483 A | * | 4/1997 | Nokubo | 417/363 |
| 5,927,389 A | * | 7/1999 | Gonsalves et al. | 165/121 |
| 6,269,001 B1 | * | 7/2001 | Matteson et al. | 361/695 |
| 6,682,569 B2 | * | 1/2004 | Wilkinson et al. | 623/35 |
| 2006/0029492 A1 | * | 2/2006 | Kao | 415/119 |
| 2007/0135033 A1 | * | 6/2007 | Kao et al. | 454/184 |
| 2007/0153477 A1 | * | 7/2007 | Liang | 361/695 |

FOREIGN PATENT DOCUMENTS

| | | | |
|---|---|---|---|
| JP | 2000027799 A | * | 1/2000 |
| KR | 2006026748 A | * | 3/2006 |

OTHER PUBLICATIONS

Golledge et al. Pluggable Fan Module, IBM Technical Disclosure Bulletin, Aug. 1989, pp. 342-343.*

* cited by examiner

*Primary Examiner*—Jayprakash N Gandhi
*Assistant Examiner*—Robert J Hoffberg

(57) ABSTRACT

A fixing mechanism fixes a side of a fan frame having a plurality of cooling fans and provided with a locking elastic tab having a second locking portion to a bottom board of a housing of an electronic device. The fixing mechanism includes a fixing tab fixed to the bottom board; a locking tab corresponding to the locking elastic tab and vertically installed on the fixing tab for fixing the fan frame, the locking tab having a first locking portion for being locked to the second locking portion; and an elastic buffer installed between the first locking portion and the second locking portion, for reducing vibration generated due to the spinning of the cooling fans.

9 Claims, 2 Drawing Sheets

FIXING MECHANISM FOR A FAN FIXING FRAME

BACKGROUND OF THE INVENTION

1. Field of the Invention

This invention generally relates to fixing mechanisms, and more specifically, to a fixing mechanism for a fan frame.

2. Description of Related Art

Servers rely on cooling fans to dissipate heat. Generally, a cooling fan applied in a server and a fan frame in which the cooling fan is installed are assembled to form a cooling fan assembly.

The fan frame is fixed to a bottom board of a housing of the server by screws. Two fixing mechanisms made of bended plates each having two bended ends are installed on two sides of the fan frames. For both of the fixing mechanisms, one of the bended ends is fixed to the fan frame, and the other of the bended ends is fixed to the bottom board of the housing by screws, such that the fan frame is fixed to the bottom board of the housing. In operation, the cooling fan vibrates and makes noises. To reduce the noises, an elastic washer is mounted on a screw first and then the screw with the elastic washer mounted is screwed to the bottom board of the housing.

However, the screw, if being mounted with the elastic washer and having too few screw threads easily loosen from the bottom board of the housing. Therefore, the cooling fan makes louder noises.

Moreover, the elastic washer becomes thinner than it used to be because it is pressed by the screw, and too thin the elastic washer has poor vibration absorbing capability. Further, the elastic washer, if being pressed for a long time, shows elastic fatigue.

SUMMARY OF THE INVENTION

In view of the disadvantages of the prior art mentioned above, it is a primary objective of the present invention to provide a fixing mechanism for a fan frame, which is capable of providing an excellent shock absorber quality.

It is another objective of the present invention to provide a fixing mechanism for a fan frame, which is made of highly durable vibration absorbing material.

It is a further objective of the present invention to provide a fixing mechanism for a fan frame, which is capable of providing an excellent shock absorber quality as well as high stability.

To achieve the aforementioned and other objectives, a fixing mechanism is provided according to the present invention. The fixing mechanism fixes a side of a fan frame having a plurality of cooling fans and provided with a locking elastic tab having a second locking portion to a bottom board of a housing of an electronic device. The fixing mechanism includes a fixing tab fixed to the bottom board; a locking tab corresponding to the locking elastic tab and vertically installed on the fixing tab for fixing the fan frame, the locking tab having a first locking portion for being locked to the second locking portion; and an elastic buffer installed between the first locking portion and the second locking portion, for reducing vibration generated due to the spinning of the cooling fans.

Compared with the elastic washer of the prior art which provides limited buffer effect because of the strong extruding pressure from the screw, the elastic buffer of the fan frame fixing mechanism of the present invention is installed between the locking tab and the locking elastic tab, and the elastic buffer has less extruding pressure on and thus has higher elastic deformation capacity compared with the elastic washer of the prior art, thereby providing higher shock-proof effect.

In addition, compared with the prior art, wherein, the elastic washer is easily to have the disadvantages of elastic fatigue and low durability after keeping in the same elastic deformation for a long while, and since the elastic buffer of the fan frame fixing mechanism of the present invention has elasticity, while receiving extruding pressure, it is capable of stretching with full elasticity and thus does not easily produce elastic fatigue.

Furthermore, the fixing mechanism is for fixing the fan frame by means that the first locking portions of the locking tab is locking up to the second locking portions of the locking elastic tab of the fan frame, and the fixing mechanism itself can be fixed to the case bottom board by means of riveting, screw locking, welding, and others, the fixing mechanism can be steadily fixed to the case bottom board without the need of elastic washers for the screws that are for fixing the fixing mechanism to the case bottom board as in the prior art.

In view of the aforementioned description, the fan frame fixing mechanism of the present invention is capable of overcoming the drawbacks in the prior art, thereby having high advantageous value of production.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
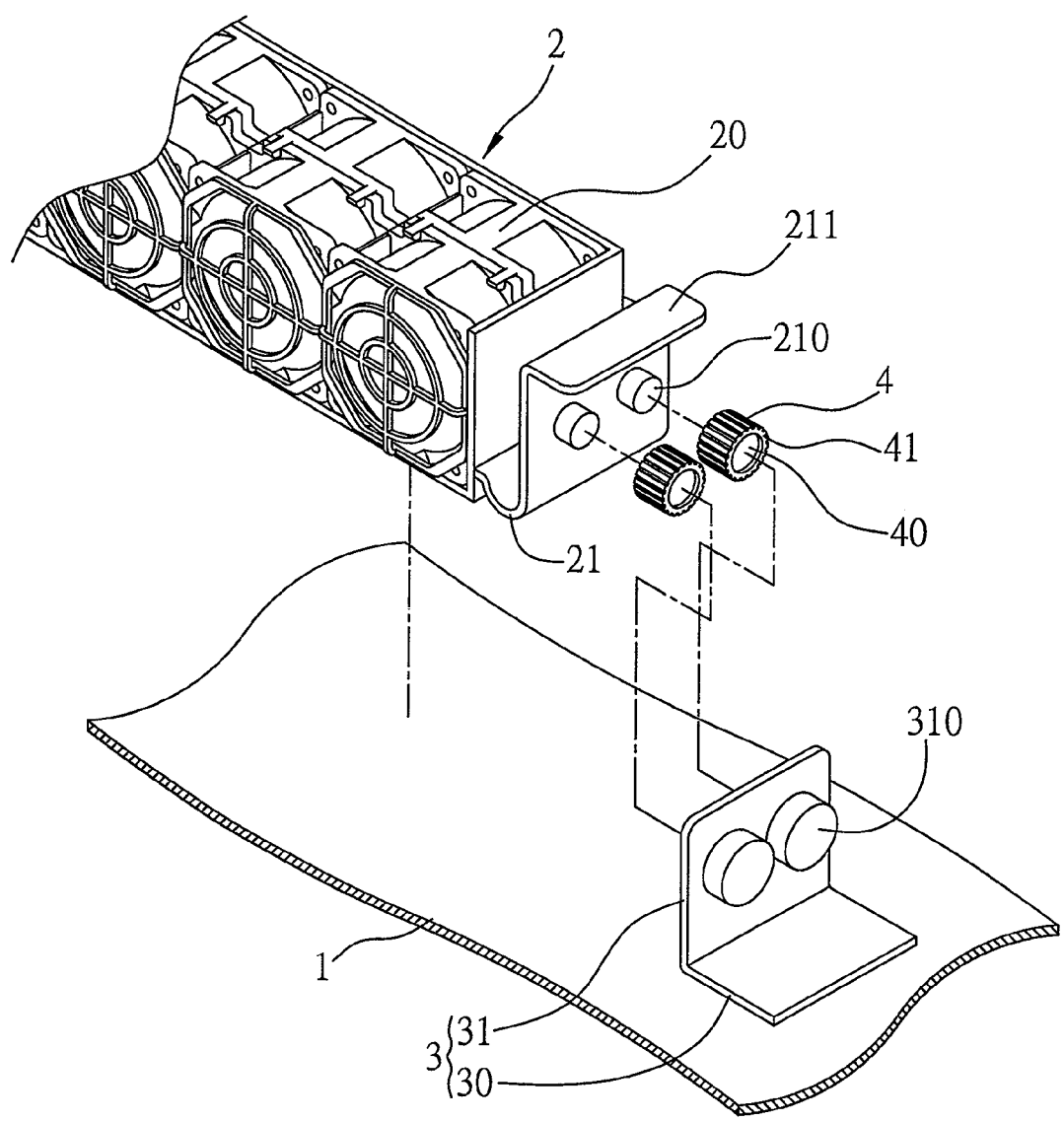
FIG. 1 is an exploded view of a fixing mechanism for fixing a fan frame to a bottom board of a housing of the preferred embodiment according to the present invention.

Please refer to FIG. 1, which is an exploded view of a fixing mechanism 3 for fixing a fan frame 2 to a bottom board 1 of a housing of the preferred embodiment according to the present invention. The bottom board 1 of the housing can be installed in an electronic device (not shown) such as a server for carrying a motherboard, on which a heat generating device, such as a memory card or a central processing unit (CPU), is installed. The fan frame 2 is installed on the bottom board 1. A plurality of cooling fans 20 are installed in the fan frame 2 for dissipating heat generated by the heat dissipating device. Two opposing sides of the fan frame 2 can be fixed to the bottom board 1 by the fixing mechanism 3. Since the two sides of the fan frame 2 have similar structure, only one of them is illustrated in FIG.

2 for clarifying the technical features of the present invention. Besides, note that the fan frame 2 can have only one of the two sides be fixed to the bottom board 1 by the fixing mechanism 3, and have the other one be fixed to the bottom board 1 by means of inserting, pivoting, or other fixing techniques.

The fixing mechanism 3 comprise a fixing tab 30 fixed to the case bottom board 1, and a locking tab 31 vertically installed on the fixing tab 30 for fixing the fan frame 2. The locking tab 31 has a plurality of first locking portions 310. The fixing tab 30 can be fixed to the bottom board 1 by means of riveting with rivets, locking up with screws, or even welding.

The fan frame 2 has a locking elastic tab 21 corresponding to the locking tab 31. The locking elastic tab 21 has a plurality of second locking portions 210 for being locked to the first locking portions 310. An elastic buffer 4 is installed between each of the second locking portions 210 and each of the first locking portions 310, to reduce the vibration generated due to the spinning of the cooling fans 20.

The first locking portion 310 can be a groove portion far from the fan frame 2, the second locking portion 210 can be a raised portion far from the fan frame 2, and the elastic buffer 4 is in a cap shape for covering the raised portion of the second locking portion 210. Of course, the first locking portion 310 can be a raised portion, and the second locking portion 210, accordingly, can be a groove portion.

In addition, an operation tab 211 is installed on a top end of the locking elastic tab 21, for providing users with operation convenience.

Figure 2:
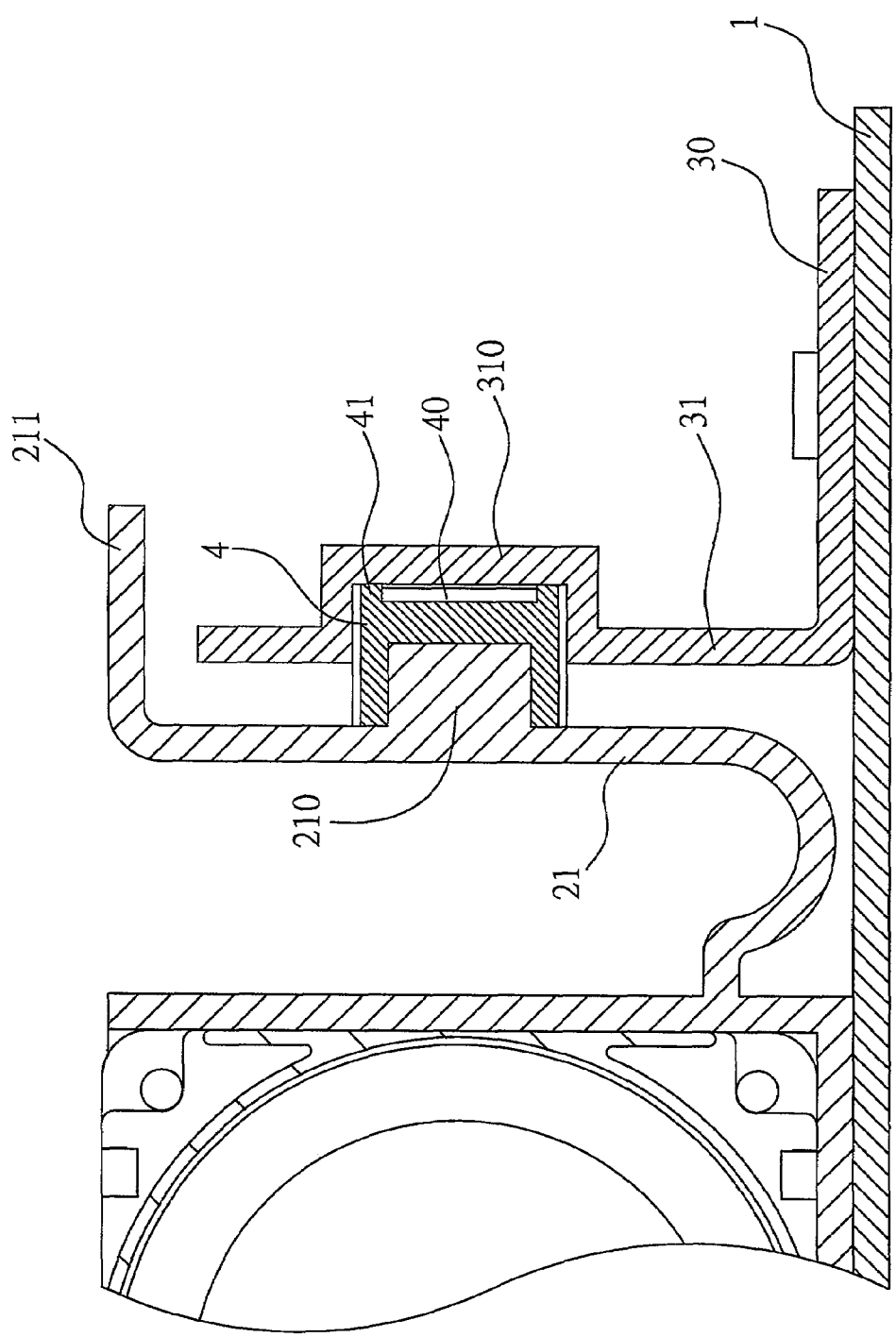
FIG. 2 is a side view of the fixing mechanism fixing the fan frame to the bottom board shown in FIG. 1.

The elastic buffer 4 has a wavy loop side, in order to enhance the adhesive force as well as add in elastic buffer space. Referring to FIG. 2. The elastic buffer 2 has a cap-shaped top cover 40 and a buffer ring 41 raised and installed on the top cover 40. The buffer ring 41 reduces the contact area between the top cover 40 and the first locking portion 310.

The fixing mechanism of the present invention is applicable to a cooling fan for absorb vibration. To obtain its function as a snubber, the elastic buffer 4 is mounted on the second locking portion 210 first, then the locking elastic tab 21 is pulled to position the fan frame 2 on a predetermined position, the locking elastic tab 21 is then released and rebounds and is locked to the locking tab 31. Therefore, the elastic buffer 4 is installed between the locking elastic tab 21 and the locking tab 31 and absorb the vibration generated due to the spinning of the cooling fans 20.

Compared with the elastic washer of the prior art which provides only limited buffer effect because of the strong extruding pressure from the screw, the elastic buffer 4 of the fan frame fixing mechanism of the present invention is installed between the locking tab 31 and the locking elastic tab 21, and the elastic buffer 4 has less extruding pressure on and thus has higher elastic deformation capacity compared with the elastic washer of the prior art, thereby providing higher shockproof effect.

In addition, compared with prior art, wherein, the elastic washer is easily to have the disadvantages of elastic fatigue and low durability after keeping in the same elastic deformation capacity for a long while, and since the elastic buffer 4 of the fan frame fixing mechanism of the present invention receives extruding pressure that has elasticity, it is capable of stretching with full elasticity, and thus does not produce elastic fatigue easily.

Furthermore, the fixing mechanism 3 is integrated to the fan frame 2 by means that the locking tab 31 and the locking elastic tab 21 are locking up to each other, and the fixing mechanism 3 itself can be fixed to the case bottom board by means of riveting, screwing, welding, and others, thus the fixing mechanism 3 can be steadily fixed to the case bottom board without the need of elastic washers for the screws that are for fixing the fixing mechanism to the case bottom board as in the prior art.

In view of the aforementioned description, the fan frame fixing mechanism of the present invention is capable of overcoming the drawbacks in the prior art, thereby having high advantageous value of production.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A fixing mechanism for a fan frame, for fixing a side of the fan frame having a plurality of cooling fans and provided with a locking elastic tab having a second locking portion to a bottom board of a housing of an electronic device, the fixing mechanism comprising:
    a fixing tab fixed to the bottom board;
    a locking tab corresponding to the locking elastic tab and vertically installed on the fixing tab for fixing the fan frame, the locking tab having a first locking portion for being locked to the second locking portion; and
    an elastic buffer installed between the first locking portion and the second locking portion, for reducing vibration generated due to the spinning of the cooling fans.

2. The fixing mechanism of claim 1, wherein the first locking portion is a groove portion far from the fan frame, the second locking portion is a raised portion far from the fan frame, and the elastic buffer is in a cap shape and is mounted on the raised portion.

3. The fixing mechanism of claim 2, wherein the cap-shaped elastic buffer has a wavy loop side.

4. The fixing mechanism of claim 2, wherein the cap-shaped elastic buffer has a cap-shaped top cover and a buffer ring raised and installed on the top cover.

5. The fixing mechanism of claim 1, wherein the first locking portion is a raised portion far from the fan frame, the second locking portion is a groove portion far from the fan frame, and the elastic buffer is in a cap shape and is mounted on the raised portion.

6. The fixing mechanism of claim 5, wherein the cap-shaped elastic buffer has a wavy loop side.

7. The fixing mechanism of claim 5, wherein the cap-shaped elastic buffer has a cap-shaped top cover and a buffer ring raised and installed on the top cover.

8. The mechanism of claim 1, wherein the locking elastic tab further comprises an operating tab on a top end of the locking elastic tab.

9. The fixing mechanism of claim 1, wherein the fixing tab is fixed to the bottom board by means of one selected from the group consisting of riveting, screw locking, and welding techniques.

* * * * *